(12) United States Patent
Sharma et al.

(10) Patent No.: US 8,983,676 B2
(45) Date of Patent: Mar. 17, 2015

(54) SYSTEM FOR COOLING A HEAT-GENERATING DEVICE

(75) Inventors: Ratnesh K. Sharma, Union City, CA (US); Sergio Escobar-Vargas, Santa Clara, CA (US); Wayne R. Mack, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 751 days.

(21) Appl. No.: 13/244,516

(22) Filed: Sep. 25, 2011

(65) Prior Publication Data

US 2012/0022715 A1 Jan. 26, 2012

Related U.S. Application Data

(62) Division of application No. 11/829,716, filed on Jul. 27, 2007, now Pat. No. 8,046,113.

(51) Int. Cl.
| | |
|---|---|
| *G05D 23/19* | (2006.01) |
| *F28D 3/00* | (2006.01) |
| *G05D 23/22* | (2006.01) |
| *H01L 23/34* | (2006.01) |
| *H01L 23/427* | (2006.01) |
| *H01L 23/473* | (2006.01) |

(52) U.S. Cl.
CPC ............ *G05D 23/2225* (2013.01); *H01L 23/34* (2013.01); *H01L 23/427* (2013.01); *H01L 23/4735* (2013.01)
USPC ............................................ 700/300; 62/171

(58) Field of Classification Search
USPC ................................................. 700/299, 300
See application file for complete search history.

(56) References Cited

U.S. PATENT DOCUMENTS

| | | | |
|---|---|---|---|
| 6,484,521 B2 | 11/2002 | Patel et al. | |
| 6,550,263 B2 | 4/2003 | Patel | |
| 6,595,014 B2 | 7/2003 | Malone et al. | |
| 6,925,364 B1 * | 8/2005 | Huberman et al. | 700/300 |
| 7,204,832 B2 | 4/2007 | Altshuler et al. | |
| 2004/0060313 A1 * | 4/2004 | Tilton et al. | 62/259.2 |
| 2006/0162363 A1 * | 7/2006 | Sharma et al. | 62/259.2 |
| 2007/0290702 A1 * | 12/2007 | Lee | 324/760 |

FOREIGN PATENT DOCUMENTS

| | | |
|---|---|---|
| KR | 1020030003144 | 1/2003 |
| KR | 1020040063628 | 7/2004 |

OTHER PUBLICATIONS

Lin, L., Ponnappan, R. "Heat Transfer Characteristics of Spray Cooling in a Closed Loop". International Journal of Heat and Mass Transfer 46 (2003): 3737-3746.*
International Search Report and Written Opinion on PCT Application No. PCT/US2008/008719, dated Dec. 31, 2008, 10 pages.

* cited by examiner

*Primary Examiner* — Ryan Jarrett
(74) *Attorney, Agent, or Firm* — Mannava Kang

(57) ABSTRACT

A method for cooling a heat-generating device, comprising setting a reference surface temperature of the heat-generating device, measuring a temperature of a surface of the heat-generating device, measuring a temperature gradient based on temperature measurements of two or more different locations on the heat-generating device, implementing a closed-loop control based on the reference surface temperature, the measured surface temperature, and the measured temperature gradient of the heat-generating device to compute a rate of application of a cooling material to the surface of the heat-generating device, and providing a command to apply the cooling material to the surface of the heat-generating device at the calculated rate to cool the heat-generating device.

15 Claims, 4 Drawing Sheets

SYSTEM FOR COOLING A HEAT-GENERATING DEVICE

CROSS-REFERENCE TO RELATED APPLICATIONS

The present application is a divisional of non-provisional application Ser. No. 11/829,716, filed Jul. 27 2007, now U.S. Pat. No. 8,046,113 the contents of which are incorporated herein by reference in their entirety.

BACKGROUND

With the advent of semiconductor devices having increasingly large component densities, the removal of heat generated by the devices has become an increasingly challenging technical issue. In the past, the low power dissipation of most chips accommodated the use of low cost, air-cooled or and liquid-convection heat sinks. However, many modern higher power-dissipation semiconductor chips now require substantially greater heat dissipation than heat sinks can reasonably provide.

A number of cooling methods currently exist that can provide high heat transfer rates that are desirable for cooling the higher-dissipation devices. Some of the more efficient cooling methods are the direct-fluid cooling methods, such as micro-channel cooling, spray-cooling, and jet impingement cooling, wherein a cooling fluid is introduced directly on the device to cool off the device. A direct-fluid method typically involves multi-phase cooling, because it involves a transformation of an amount of the applying cooling fluid from a liquid phase to a vapor/gas phase once it absorbs the heat generated from the applied device.

Thermal management of heat-generating devices involves a stable balance between the heat flux in such devices and the heat dissipated by the cooling mechanism, such as cooling fluid. Although multi-phase cooling provides high heat transfer rates, they are unstable at such high rates. That is because such high heat dissipation rates cannot be sustained for long periods of time due to an onset of unstable equilibrium. This is especially true for direct-phase cooling, such as direct-fluid cooling wherein the phase-changing fluid is applied directly to the surface of heat-generating devices and thus highly dependent on surface conditions of such devices. Thus, such a cooling method is forced to operate at lower performance to provide stability.

Accordingly, it is beneficial to have the ability to properly manage a direct-phase cooling method, such as a direct-fluid cooling method, for high heat dissipation in a heat-generating device so as to provide optimum performance and surface thermal conditions for such a device.

BRIEF DESCRIPTION OF THE DRAWINGS

Embodiments are illustrated by way of example and not limited in the following figure(s), in which like numerals indicate like elements, in which.

DETAILED DESCRIPTION

For simplicity and illustrative purposes, the principles of the embodiments are described by referring mainly to examples thereof. In the following description, numerous specific details are set forth in order to provide a thorough understanding of the embodiments. It will be apparent however, to one of ordinary skill in the art, that the embodiments may be practiced without limitation to these specific details. In other instances, well known methods and structures have not been described in detail so as not to unnecessarily obscure the embodiments.

Figure 1:
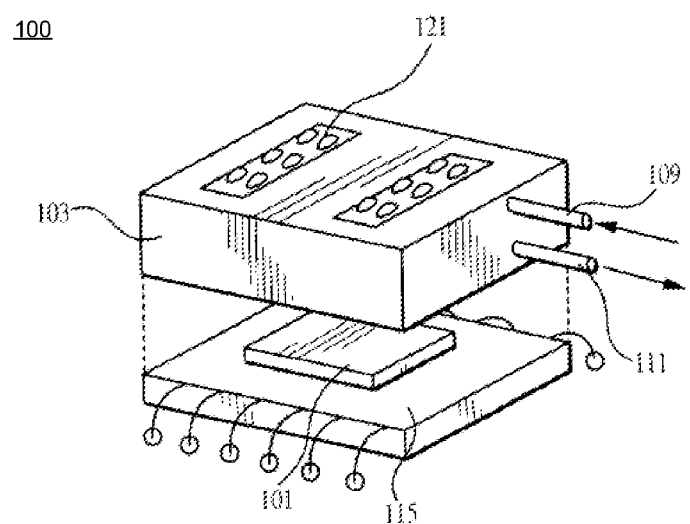
FIG. 1 illustrates one view of a layout of a cooling system for cooling a heat-generating device, in accordance with one embodiment.
Figure 2:
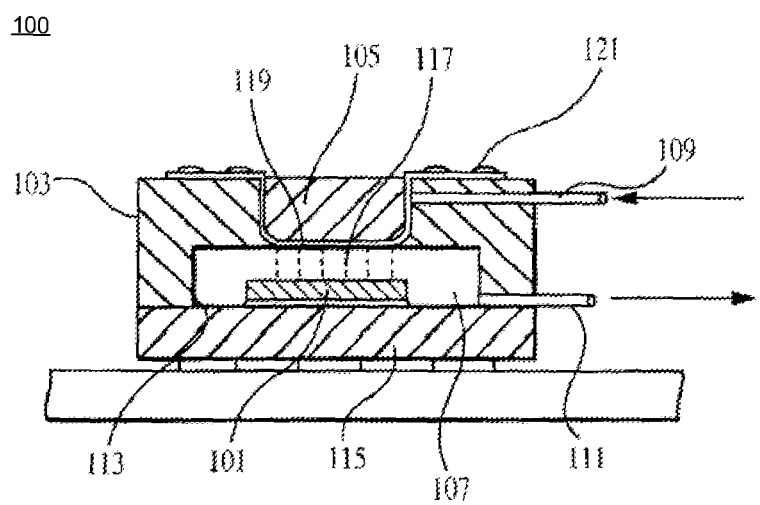
FIG. 2 illustrates another view of a layout of a cooling system for cooling a heat-generating device, in accordance with one embodiment.

FIGS. 1-2 illustrate a layout of a spray-cooling system 100 for cooling a heat-generating device, in accordance with one embodiment. It should be understood that the following description of the system 100 is but one manner of a variety of different manners in which such a spray-cooling system may be configured. The spray-cooling system 100 is an example of a direct-fluid cooling system, for which one or more embodiments for cooling management as described herein may be applied. Thus, it should be understood that discussions of such cooling management embodiments are also applicable to other direct-fluid cooling systems, such as micro-channeling cooling systems, spray-cooling methods, and jet impingement methods.

Referring to FIG. 1, the cooling system 100 is configured for cooling one or more heat-generating devices, such as a semiconductor chip 101. The cooling system 100 includes a body forming a cooling cap 103, and one or more spray mechanisms 105. The cap 103 and spray mechanisms 105 are, for example, integrated into a single cooling assembly. The cap 103 is configured to form a spray chamber 107 in which cooling fluid can be sprayed into thermal contact with, and preferably directly onto, the chip 101. A grid of temperature sensors (not shown), such as thermocouple devices or capacitance sensors, may be placed on the top surface of the chip 101 and embedded within the chip 101 to measure temperature. The heat rate is measured using temperature gradients across the surface and beneath the surface (with embedded sensors). Temperature and heat rate are then received, calculated, and used by a controller (not shown) to control the rate of fluid delivery to each region of the thermally-managed surface of the chip 101. The spray mechanism includes an inlet 109 for receiving cooling fluid, preferably in a liquid state. An outlet 111 for liquid and/or gaseous cooling fluid operably extends from the spray chamber.

In one example, the cap 103 includes a concave portion having surfaces 113 that form a cavity configured to conformingly adjoin to one or more surfaces of a component substrate 115 that is both electrically connected to and carrying the chip 101. Here, the component substrate and chips form a package with which the cap is associated. The package is preferably in the conventional form of an integrated circuit component that has not received an encapsulant or lid. When the cavity of the cap 103 conformingly adjoins the component substrate 115, the spray chamber 107 is formed, containing at least the portions of the semiconductor devices to be spray cooled. The cap 103 is preferably made of a material having a thermal coefficient of expansion substantially matching that of the component substrate. In one example, the cap 103 is retained against the component substrate 115 by an adhesive, a clamping mechanism, fasteners, or other attachment-type mechanisms, and a seal is formed such that liquid and vapor cooling fluid do not escape the spray chamber other than through designed orifices. The component substrate 115 is preferably configured to be vapor and liquid tight, but could be configured with a designated orifice, such as an outlet. The cap 103 forms a package-level cooling system to be affixed to the package and thereby form a cooled package.

The spray mechanism 105 is configured to spray cooling fluid onto the one or more chips 101, which heat and vaporize some or all of the cooling fluid. The cooling fluid vapor that forms during the cooling process is retained in an enclosed spray chamber around the chips. In one example, the spray mechanism 105 is an incremental sprayer configured to eject an incremental amount of the cooling fluid on the chip 101. The cooling fluid is typically sprayed in response to energizing control signals received via electrical contacts 121, which are mounted on the cap 103 and provide inputs to the spray mechanism 105. In one example, the control signals are sent to the spray mechanism 105 by the same controller noted earlier, which receives feedbacks from the temperature sensors mounted on or within the chip 101. The quantity of liquid sprayed from an incremental sprayer may be highly controllable, such as by controlling the rate at which incremental amounts of cooling fluid are ejected. For example, by increasing or decreasing the frequency that an incremental sprayer is energized, the flow rate can be accurately adjusted. Additionally, because such a sprayer can be configured to deliver very small quantities of cooling fluid, and because a large number of sprayers can be fit into a small area, the heat distribution over that area can be accurately controlled by energizing some of the sprayers at a rate greater than that of other sprayers. These features provide for accurate delivery of cooling fluid at precise and controllable rates. Furthermore, incremental sprayers can be modular, offering quickly and easily replaceable units. An example of a type of incremental sprayer for the spray mechanism 105 is an inkjet-type sprayer, such as a thermal inkjet sprayer (TIJ sprayer).

Although a cooling fluid is used to describe the cooling system 100, it should be understood that the cooling fluid may be replaced with any cooling phase change material (PCM) that is capable of deforming and spreading out across a surface of the heat-generating device in a manner similar to a fluid to absorb heat from such a device. As referred herein, a PCM is configured to change phase, for example, from a liquid to a gas at a predetermined temperature. Thus, a cooling PCM generally operates to dissipate heat by changing its phase to absorb the heat.

Figure 3:
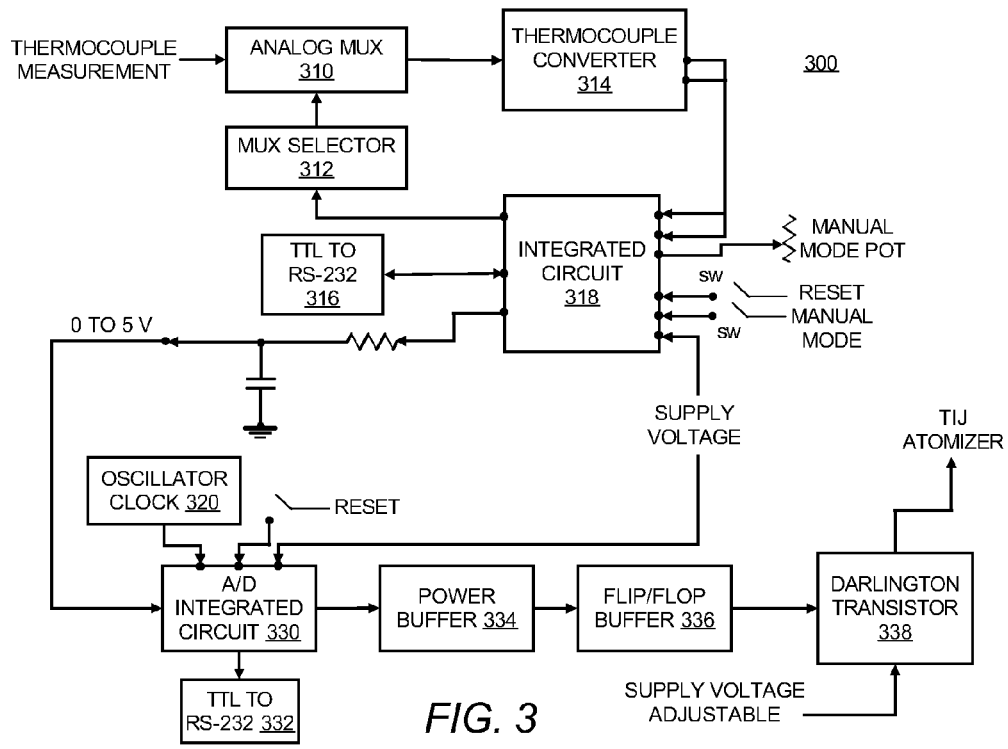
FIG. 3 illustrates a controller for controlling a cooling system in accordance with one embodiment.

The operation of cooling system 100 is controlled via a software or hardware controller, as noted earlier. The controller can be separate from the cooling system 100, whereby both may act as subsystems that may be combined together to form an overall integrated cooling system. A single controller may control the operation of one or a plurality of cooling systems 100. Alternatively, the controller can be mechanical in nature, or incorporated within a chip that is being cooled by the system. FIG. 3 illustrates an example of a controller 300 that is operable to control the operation of a cooling system 100. It should be understood that the following description of the controller 300 is but one manner of a variety of different manners in which such a spray-cooling system may be configured.

The controller 300 provides an input section that includes an analog multiplexer (mux) 310, a mux selector 312, and a thermocouple converter 314 for receiving temperature measurements from the temperature sensors mounted on and within the chip 101. An integrated circuit (IC) 318 acts as a processing unit to execute software or firmware stored therein (e.g., in a computer readable medium such as a read-only memory or ROM chip or the like) to control the input section to select and receive temperature measurements, such as thermocouple measurements, from the different temperature sensors, such as thermocouples, mounted to the chip 101 in a manner understood in the art. The IC 318 may be an application specific integrated circuit (ASIC) or a general-purpose computer processor, such as one manufactured by Intel, AMD, or Cyrix. The IC 318 also executes software or firmware stored therein to implement a digital closed-loop or feedback control algorithm to achieve stable high heat flux and optimum surface thermal conditions of the chip 101. Based on the implemented control algorithm, the IC 318 calculates and outputs the necessary parameters to an output section of the controller 300 so as to control the operations of the spray mechanism 105 in the cooling system 100. In one example, the controller's output section includes an oscillator clock 320, a multipurpose analog and digital (A/D) IC 330, a power buffer 334, an analog flip/flop buffer 236, and a Darlington transistor 338. The ND IC 330, such as a PIC microcontroller from Microchip Technology of Chandler, Ariz., includes analog and digital channels to provide multipurpose functions. Here, the ND IC 330 used the calculated parameters provided by the main controller IC 318 to calculate or compute the actual frequency or delays so as to output energizing control signals (in the form of low level commands through the channels on the IC 330) to switch the firing pattern of the spray mechanism(s) 105 (represented by the TIJ atomizer output), in a manner understood in the art for spray cooling, at which fixed incremental amounts of cooling fluid are ejected from the spray mechanism 105 onto the chip 101. As illustrated, the controller 300 further includes interfaces, such as the transistor-transistor logic (TTL) to RS-232 terminals 316 and 332, throughout the controller to allow connection of external devices (such as computers) thereto. These interfaces enable information about the controller 300 at various stages to be passed on to external devices as desired by a user for any purposes, such as diagnostics or maintenance of controller 300, the cooling system 100, or both.

Figure 4:
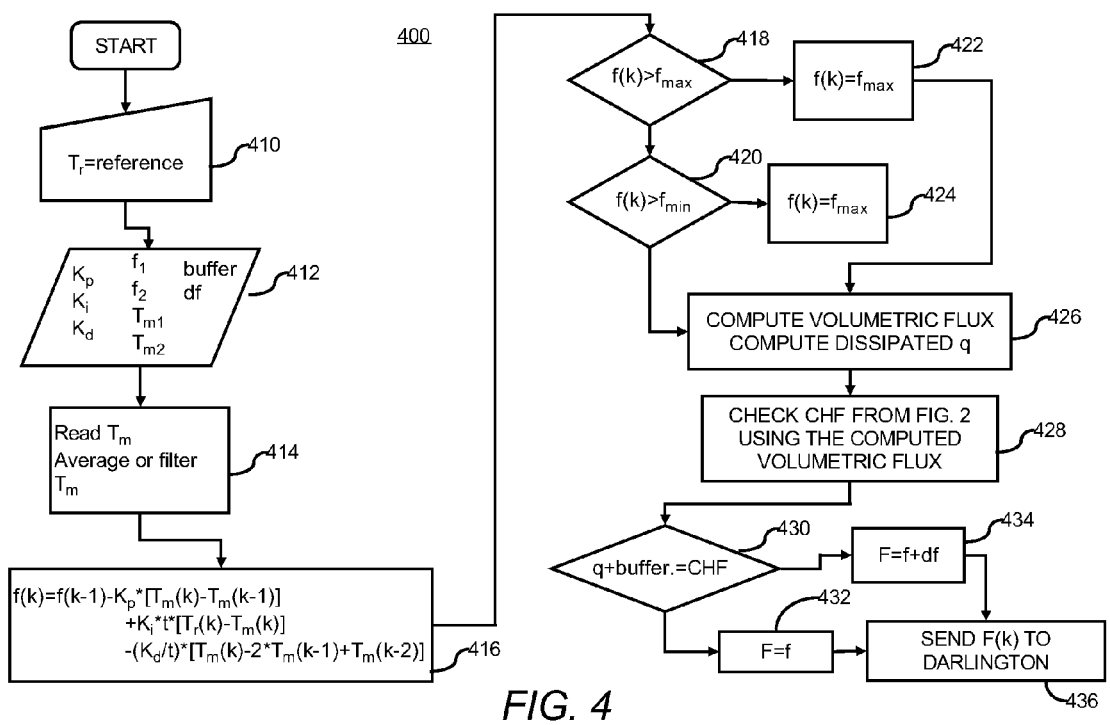
FIG. 4 illustrates a method for thermal management of a heat-generating device in a cooling system, in accordance with one embodiment.

FIG. 4 illustrates a thermal management method 400 for a thermal-management controller, such as the controller 300, to implement a closed-loop control of the cooling system 100 to control the fluid (or other PCM) delivery to the surface of a heat-generating device, such as the semiconductor chip 101, to ensure optimum fluid film conditions and achieve stable high heat flux and optimum surface thermal conditions of the device. This method 400 continuously run during the operation of the cooling system 100. For illustrative purposes only and not to be limiting thereof, the method 400 is discussed in the context of the controller 300 (FIG. 3) and the cooling system 100 (FIGS. 1-2).

At 410, the method 400 starts by setting a reference surface temperature, $T_{REF}$ for the chip 101 in the IC 218 of the controller 300. $T_{REF}$ may be set by IC 218 as desired by the chip designer or any interested system user based on, for example, design specifications of the chip 101, including the processing speed and power consumption of the chip 101 and corresponding surface temperature range that would maintain the chip 101 in operation. This step is performed prior to the operation of the controller 300.

At 412, additional constants are also set or initialized for use with a desired closed-loop control algorithm implemented in the IC 218. For example, if the desired closed-loop control algorithm includes a proportional/integral/derivative (PID) type linear controller, the constants $K_P$, $K_I$, and/or $K_D$ are provided by the chip designer or any interested system user based on the desired control algorithm. Other set constants include the tolerance range or buffer for dissipated heat from the chip 101, the maximum and minimum frequencies (or rates), $f_{MAX}$ and $f_{MIN}$, at which fixed incremental amounts of cooling fluid are to be ejected from the spray mechanism 105, the incremental amount df for increasing the frequency or rate of fluid ejection from the spray mechanism 105, and the max and minimum temperatures, $T_{MAX}$ and $T_{MIN}$ that may be used to filter the temperatures detected from the chip 101.

At 414, the controller 300 measures the temperature of the chip 101 continuously by receiving temperature measurements from temperature sensors on and within the chip 101, and averaging (or filtering with $T_{MAX}$ and $T_{MIN}$) such temperature measurements to come up with the surface temperature $T_M$ of the chip 101 at each particular measurement time instance and the temperature gradient ΔT of the chip 101. ΔT serves a measurement proxy for the heat flux in the chip 101. In one example, the temperature gradient ΔT provides a difference in temperatures at different locations of the chip 101 at each particular measurement time instance, such as on the chip surface and within the chip to provide a temperature gradient substantially perpendicular or orthogonal to the chip surface.

At 416, once the IC 218 receives (and calculates as needed) the measured $T_M$ and ΔT, it proceeds to digitally implement the desired closed-loop control algorithm (i.e., discretized control algorithm) to provide thermal management of the chip 101. Any suitable closed-loop control algorithm that employs $T_{REF}$ as an input and $T_M$ as a feedback may be used here, including linear control algorithms such as PID control, non-linear control algorithms such as non-linear optimal controls, and non-classical algorithms such as neural networks and fuzzy logic. FIG. 4 illustrates the closed-loop control algorithm used in step 416 as a discretized PID control algorithm. Based on the implementation of the closed-loop control algorithm, the controller 300 outputs a discretized or digital energizing control signal f(k), where k represents the digital sampling, to the spray mechanism 105 to indicate the desired frequency at which the incremental amounts of cooling fluid are to be ejected from the spray mechanism 105 for application to the surface of the chip 101.

At 418 and 420, the output control frequency f(k) is compared against the predefined $f_{MAX}$ and $f_{MIN}$.

At 422, if f(k)>$f_{MAX}$, then f(k) is set to $f_{MAX}$. At 424, if f(k)<$f_{MIN}$, then f(k) is set to $f_{MIN}$. Of course, if f(k) is within the operating range between $f_{MAX}$ and $f_{MIN}$, it is passed through.

At 426, the value f(k) is used to compute or calculate the volumetric flux, or rate of volume flow across the chip 101, of the cooling fluid. In one example, the volumetric flux, or the rate of volume flow across a unit area, is computed based on past empirical data obtained on the cooling system 100 and its spray mechanism(s) 105 that provides a look-up table of how much fluid the spray mechanism 105 is able to deliver at specific frequencies f(k) (with interpolation and extrapolation of available look-up values as needed). Also, from the measured ΔT, the dissipated heat q of the chip 101 is computed or calculated, for example, from the one-dimensional heat conduction Fourier's law of the form, $$q = -K\frac{\Delta T}{dx},$$

where q is the dissipated heat (units W/m2), K is the thermal conductivity of the hot body (the body being cooled) (units W/(m*K), i.e., the chip 101, and $dx=x_2-x_1$ is the distance between the two temperature sensors (units m) that provides the measured ΔT.

At 428, once the volumetric flux is know, the possible critical heat flux (CHF) with this volumetric flux is estimated or derived by using empirical or experimental data previously obtained (e.g., stored in the IC 218 as a lookup table). The CHF describes a local maximum heat dissipation level within a reasonable excess temperature range, beyond which the efficiency of heat transfer is decreased, thus causing localized overheating of the heating surface.

At 430, the computed dissipated heat q plus some tolerance range or buffer (previously set at 412), i.e., q+buffer, is compared against the estimated CHF.

At 432, if the computed dissipated heat q plus some tolerance range or buffer (previously set at 412), i.e., q+buffer, is less than the estimated CHF, then f(k) is passed through as F(k) and converted to an analog command signal for output at 436 to the spray mechanism 105 in the cooling system 100 to control its rate of fluid ejection.

At 434, however, if q+buffer is equal to or larger than the estimated CHF, then the control frequency f(k) is increased by a predefined df (also previously set at 412), or F(k)=f(k)+df, and F(k) is passed through and converted to an analog command signal for output at 436 to the spray mechanism 105 in the cooling system 100 to control its rate of fluid ejection.

Accordingly, the systems and methods as described herein combine surface temperature and heat flux monitoring for precise thermal management. That is, any degradation of the cooling process relating to surface conditions (e.g., conditions of the cooling liquid film on the chip 101), fluid supply (e.g., from the cooling system 100 and its spray mechanism 105 therein), or any other factors may be captured by the monitoring schemes described above (e.g., using measured temperature gradient as a proxy for the heat flux) to thereby enable the control schemes as also described above to adapt accordingly. Furthermore, although embodiments have been described in the context of multi-phase cooling, such embodiments may be used for single or multi-phase thermal management solutions to improve the performance of the thermal management solution by increasing the heat transfer performance.

What has been described and illustrated herein is an embodiment along with some of its variations. The terms, descriptions and figures used herein are set forth by way of illustration only and are not meant as limitations. Those skilled in the art will recognize that many variations are possible within the spirit and scope of the subject matter, which is intended to be defined by the following claims—and their equivalents—in which all terms are meant in their broadest reasonable sense unless otherwise indicated.

What is claimed is:

1. A system for cooling a heating-generating device therein, the system comprises:
a cooling system that directs a cooling material on a surface of the heat-generating device therein;
a plurality of temperature sensors mounted on a surface of the heat generating device and embedded in the heat-generating device; and
a controller to receive a measured temperature of the surface of the heat-generating device and a measured temperature gradient based on temperature measurements of two or more different locations on the heat-generating device for use to compute a volumetric flux for the cooling material in the cooling system and a dissipated heat of the heat-generating device, to derive a critical heat flux (CHF) of the heat-generating device based on the computed volumetric flux, to determine whether the computed dissipated heat of the heat-generating device plus a tolerance range for the computed dissipated heat is less than the derived CHF, and to set a rate of application of the cooling material on the surface of the heat-generating device based upon whether the computed dissipated heat of the heat-generating device plus the tolerance range is less than the derived CHF.

2. The system of claim 1, wherein the controller is electrically coupled to the cooling system to provide the cooling system with instructions corresponding to the set rate of application of the cooling material to the surface of the heat-generating device.

3. The system of claim 1, wherein the heat-generating device is an electronic device having at least one heat-generating component therein.

4. The system of claim 1, wherein the cooling material is a cooling phase change material (PCM).

5. The system of claim 4, wherein the cooling PCM is a cooling fluid.

6. The system of claim 5, wherein the cooling system is one of a spray-cooling system, a micro-channel cooling system, and a jet-impingement cooling system.

7. The system of claim 1, wherein the controller is to access a reference surface temperature of the heat-generating device and to compute a first rate of application of the cooling material to the surface of the heat-generating device based upon the reference surface temperature, the measured surface temperature, and the measured temperature gradient.

8. The system of claim 7, wherein the controller is to set the rate of application of the cooling material on the surface of the heat-generating device as the first rate of application in response to the computed dissipated heat of the heat-generating device plus the tolerance range being less than the derived CHF.

9. The system of claim 7, wherein the controller is to increment the first rate of application by a predetermined value and to set the rate of application of the cooling material on the heat-generating device as the incremented first rate of application in response to the computed dissipated heat of the heat-generating device plus the tolerance range being equal to or greater than the derived CHF.

10. The system of claim 1, wherein the controller is further to determine whether the set rate of application of the cooling material is within a predefined operating range, to set the set rate of application of the cooling material as a minimum value in the predefined operating range in response to the set rate of application being less than the predefined operating range, and to set the set rate of application of the cooling material as a maximum value in the predefined operating range in response to the set rate of application being more than the predefined operating range.

11. A controller for controlling a cooling system that directs a cooling material on a surface of a heat-generating device, said controller comprising:
a thermocouple converter hardware component to receive temperature measurements from temperature sensors positioned to detect temperatures of the heat-generating device; and
an integrated circuit to receive the temperature measurements from the thermocouple converter hardware component and a measured temperature gradient based on temperature measurements of two or more different locations on the heat-generating device for use to compute a volumetric flux for the cooling material in the cooling system and a dissipated heat of the heat-generating device, to derive a critical heat flux (CHF) of the heat-generating device based on the computed volumetric flux, to determine whether the computed dissipated heat of the heat-generating device plus a tolerance range for the computed dissipated heat is less than the derived CHF, and to set a rate of application of the cooling material to be directed on the surface of the heat-generating device based upon whether the computed dissipated heat of the heat-generating device plus the tolerance range is less than the derived CHF.

12. The controller of claim 11, further comprising:
an analog and digital integrated circuit having analog and digital channels to receive the set rate of application of the cooling material and to compute an actual frequency or delays to output energizing control signals to the cooling system according to the set rate of application.

13. The controller of claim 11, wherein the integrated circuit is to access a reference surface temperature of the heat-generating device, to compute a first rate of application of the cooling material to the surface of the heat-generating device based upon the reference surface temperature, the measured surface temperature, and the measured temperature gradient and to set the rate of application of the cooling material from the first rate of application of the cooling material.

14. A controller for controlling a cooling system that directs a cooling material on a surface of a heat-generating device, said controller comprising:
a processor; and
a memory on which is stored machine readable instructions that cause the processor to:
receive a measured temperature of the surface of the heat-generating device and a measured temperature gradient based on temperature measurements of two or more different locations on the heat-generating device;
compute a volumetric flux for the cooling material in the cooling system and a dissipated heat of the heat-generating device;
derive a critical heat flux (CHF) of the heat-generating device based on the computed volumetric flux;
determine whether the computed dissipated heat of the heat-generating device plus a tolerance range for the computed dissipated heat is less than the derived CHF;
set a rate of application of the cooling material on the surface of the heat-generating device based upon whether the computed dissipated heat of the heat-generating device plus the tolerance range is less than the derived CHF; and
issue a command to apply the set rate of application of the cooling material.

15. The controller according to claim 14, wherein the machine readable instructions are further to cause the processor to:
access a reference surface temperature of the heat-generating device;
compute a first rate of application of the cooling material to the surface of the heat-generating device based upon the reference surface temperature, the measured surface temperature, and the measured temperature gradient; and
set the rate of application of the cooling material from the first rate of application of the cooling material.

* * * * *